United States Patent [19]

Werrbach

[11] Patent Number: 4,843,626

[45] Date of Patent: Jun. 27, 1989

[54] MULTIBAND LIMITER WITH AUTOMATIC LIMITING THRESHOLD (ALT) COMPENSATION

[76] Inventor: Donn R. Werrbach, 627 E. Magnolia Blvd., Apt. E, Burbank, Calif. 91501

[21] Appl. No.: 884,211

[22] Filed: Jul. 10, 1986

[51] Int. Cl.[4] .............................................. H03G 3/00
[52] U.S. Cl. .................................... 381/107; 381/106
[58] Field of Search .......................... 455/223; 333/14; 381/94, 106, 108, 107

[56] References Cited

U.S. PATENT DOCUMENTS

| | | | |
|---|---|---|---|
| 4,208,548 | 6/1980 | Orban | 381/94 |
| 4,249,042 | 2/1981 | Orban | 381/106 |
| 4,327,446 | 4/1982 | Dressler | 455/223 |

Primary Examiner—Forester W. Isen
Attorney, Agent, or Firm—Irving M. Kriegsman

[57] ABSTRACT

A multiband audio frequency signal limiting apparatus suitable for use in a wide range of applications is disclosed. An input signal is divided into discrete frequency bands (any practical number is suitable) which are each passed through a separate limited and subsequently summed to obtain an output signal. The summed output signal is fed into an automatic limit threshold circuit which generates a third signal, the Automatic Limit Threshold (ALT) signal, which modifies a common limiting threshold reference for the bands. This causes the bands to limit at a higher or lower threshold level and the band output levels to increase or decrease in direct proportion to the threshold level of limiting. The ALT signal cause the bands to limit at a lower threshold when the energy content of the various bands would combine toward higher values, which could thus generate a larger than desired output signal level. In this way, the summed output signal will be servoed towards one hundred percent level regardless of the input audio frequency bandwidth (and consequently the individual relative band energy content).

15 Claims, 2 Drawing Sheets

MULTIBAND LIMITER WITH AUTOMATIC LIMITING THRESHOLD (ALT) COMPENSATION

BACKGROUND OF THE INVENTION

This invention relates to the field of audio frequency signal limiting, either for absolute peak protection, or for rms or averaging limiting as used in the various disciplines.

Audio signal handling systems frequently rely on some kind of signal limiter to act as either a safety check on peak excursion, or as a program loudness control. Peak limiters are often incorporated to protect recording and broadcasting media from effects of overmodulation. For this discussion, overmodulation may be taken to mean overcutting, overdrive, tape saturation, etc., depending on the application and the vernacular of that field of use. This relates to the condition where the absolute peak signal amplitude exceeds a defined level which may be an overload point, or a specified reference level such as 100 per cent modulation of a radio carrier.

So called "rms limiters" are used where the absolute peak amplitude is not of specific interest, but the relative volume level of the audio must be controlled or intensified.

Because signal limiters operate with very high transfer ratios (the ratio of input signal change above limit threshold to output signal change), use of signal limiting can cause unwanted sonic degradation under most operating conditions. These degradation effects are well known in the art. They are usually referred to as "pumping", "breathing", "hole punching", etc. Often, the degradation effects are dependent on the specific method of limiting employed, the amount or depth of limiting used in the application, etc.

Many schemes have been devised to make limiters that are relatively free of sonic degradation. One technique that has been variously applied is known as "multiband limiting". Through multiband limiting, effects of gain intermodulation (where the level of a quieter sound is modulated by the limiter acting upon a louder sound which is simultaneously present), are reduced by breaking up the audio frequency spectrum into several bands and limiting in the individual bands, then adding the limited band outputs together. Thus, loud sounds in one part of the spectrum will not cause reduction of sounds in another part of the spectrum under limiting conditions. The resulting audio is therefore more natural sounding after limiting.

A major problem with multiband limiting is resultant from the spectrum dissection, however. Since each band output contributes only a fractional component of the total output signal, the usual multiband limiter output level will not be well controlled for program audio with varying frequency spectrum content or bandwidth. One hundred percent output level will only be achieved when all of the bands have full output in the correct phase. Therefore, in normal applications with multiband limiters, consistently achieving 100 percent output level implies a need for either very deep program limiting, causing all bands to achieve a large output signal, or very wide program spectral bandwith filling all the bands to at least the limit threshold. Both conditions are unlikely occurences in practice. Usually, great limiting depth is impractical or undesirable due to sonic degradation as well. Thus, loud conventional multiband limiters usually require subsequent wideband limiting or clipping to obtain consistent audio level. This wideband process obviously negates the sonic advantages of the multiband process.

The present invention overcomes the fractional band summing problem of multiband limiters by automatically adjusting the limit threshold of the bands so that the total sum of the bands will equal one hundred percent of an output reference level, even if only one band of the plurality of bands contains a signal or if the relative phase of the band signals might not favor a maximum sum. An advantage of this principle, and which differentiates the method from effectively being the same process as wideband limiting after multiband limiting, is the characteristic that the automatic limiting threshold (ALT) method of this invention causes the minimum possible limiting in the process that will satisfy a 100 percent output rendition. In contrast, conventional multiband limiting followed by wideband limiting will maintain a constant limiting threshold, which will result in limiting activity of a constant nature for narrowband signals, followed by additional limiting by the wideband limiter necessary to "limit down" the varying multiband sum output level. Thus, the present invention achieves 100 percent output level for narrow band audio signals by using minimum limiting, while the conventional system achieves the same output by employing greater limiting depth.

Another way to understand the advantage of the present invention is to observe that, due to the "minimum limiting depth" rule which is followed in the ALT servo technique of multiband limiting, very consistent output level is achieved for widely varying audio signal characteristics with much fewer and less noticeable sonic side effects. Since typically less limit depth in each band is used to obtain the desired total wave limiting density, less audio equalizing effect is created by the hinging action of the multiple band limiting. Also, due to the action just described, it is possible to drive the ALT multiband limiter into greater limiting depth, as may be intentional or accidental in the various applications, before distortion or other side effects become objectionable.

There have been previous attempts to overcome the multiband consistency problem. Some such systems are described in U.S. Pat. Nos. 4,460,871, 4,208,548 and 4,249,042. The present invention represents a totally different method and approach.

Other references of interest include U.S. Pat. Nos. 3,488,604; 4,412,100; 4,371,842 and 4,495,643.

SUMMARY OF THE INVENTION

An audio limiter is described which receives an audio signal wave, divides the frequency spectrum components into two or more separate frequency bands, passes the separated spectral components through separate limiters, then sums together the output from the separate limiters to form an output signal. The output signal is fed into an automatic limit threshold circuit whose output is fed into each one of the separate limiters. The band limiter thresholds, thus output levels, are automatically controlled in such a way as to maintain a 100 percent total output level regardless of the program frequency spectral balance, or relative band energy content.

The limiter of each band is commanded by a gain control signal derived from a level detector looking at the signal in that band. The level detector compares the level of the band signal to a reference level voltage which is provided by the ALT (Automatic Limit Threshold) circuit. The gain control signal thereby generated causes the gain control means to reduce its gain. Thus, the band output signal is maintained at a constant level proportional to the ALT reference whenever the band input signal exceeds or equals the reference level.

The foregoing and various objects and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

DETAILED DESCRIPTION OF THE INVENTION

An apparatus and method for limiting an audio frequency signal is described. In the following description of the presently preferred embodiment, some specific details are given as to frequencies, time constants, etc. it will be obvious to one skilled in the art that the described invention may be employed without these specific details. In other instances, well known circuits have not been described in detail in order not to obscure the invention in unnecessary details.

The multiband system herein disclosed may be composed of any plural number of bands since the number of bands is not intrinsically important to the present invention. For ease in describing the present invention, a two band system will be assumed. This should not in any way restrict the description from being well applied to system of a greater number of bands, or to imply that the present invention should be validated only for two bands.

Also, although in this disclosure, the present invention shall be fully described in an analog embodiment, digital techniques can obviously be used to realize the operating functions. The principal teaching of the present invention can be carried forth into a totally digital audio multiband limiter system where the audio signal itself exists as digital data. The ALT principle of this invention of automatically adjusting the multiband limiter threshold would convey the same advantage if practiced in the digital domain as when practiced in analog technology.

Figure 1:
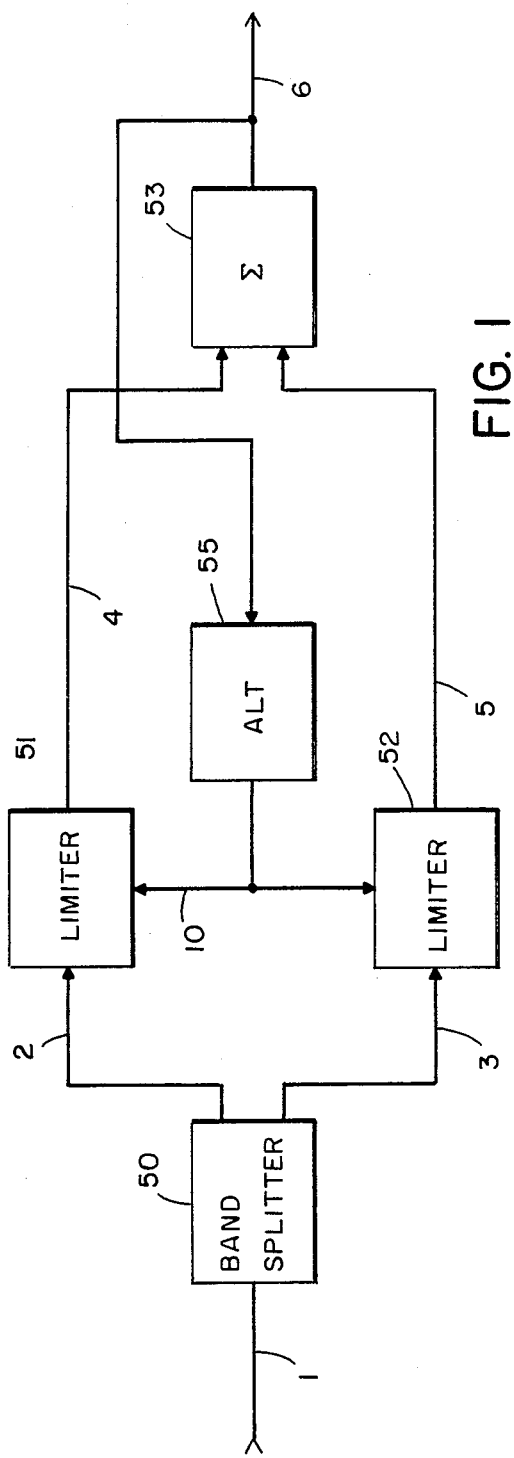
FIG. 1 is an overall block diagram of a multiband limiter constructed according to the present invention.

In FIG. 1, an audio frequency input signal present on line 1, is applied to a band splitting filter 50. The circuit for filter 50 is not herein described in detail, since many known band filtering circuits may be used. The outputs of filter 50 are on lines 2 and 3, and constitute, in this case a high band and low band output. High band line 2 feeds a signals into a first limiter 51. Low band line 3 feeds a signal to a second limiter 52. In the presently preferred embodiment, first and second limiters 51 and 52 are identical circuits. A functional diagram of one of the limiters 51 is shown in FIG. 2.

For convenience, the limiters 51 and 52 as used in the presently preferred embodiment will now be described. Application of the present invention is not limited to this specific limiter circuit, but a description of the circuit will aid in the understanding of how the present invention operates. To clarify the principles of the present invention, it is important to observe how the automatic limit threshold (ALT) reference which will hereinafter be discussed influences the limiter circuits, not how the limiter circuits derive their internal functions.

Figure 2:
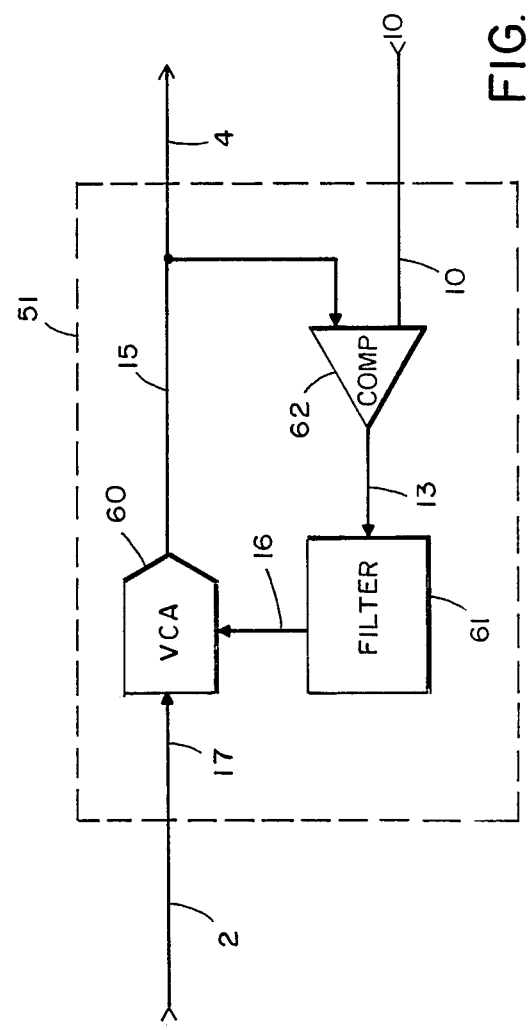
FIG. 2 is a block representation of one of the band limiters shown in FIG. 1.

Referring now to FIG. 2, the limiter input signal on line 17 is coupled to a gain control device 60, which is in the form of a voltage controlled amplifier, or VCA. The VCA 60 gain is caused to change from a standard value by a control signal applied through a control line 16. Arbitrarily, for this discussion the standard gain of VCA 60 shall be 10 dB.

The output signal present on line 15 from VCA 60 is coupled to a comparator 62. Comparator 62 compares the audio signal level on line 15 to an ALT reference signal on line 10. The ALT reference signal is in the form of a static changing DC voltage (supplied by the ALT system to be hereinafter described). When the signal on line 15 exceeds the signal on line 10, comparator 62 outputs an error signal on line 13 which is coupled to a filter 61. Filter 61 performs integration and buffering of the error signals on line 13 which are in the form of pulses. The filtered error signal, when present on line 16, causes a reduction of the VCA gain proportional to the error signal. Action of the limiters (51 and 52) in this embodiment is thus a servo operation and the audio signal level on line 15 will be caused to be equal to the ALT reference on line 10 whenever the signal level on line 17 exceeds the ALT reference level minus the standard VCA gain, in this case 10 dB. Conventional multiband limiters would operate with a fixed reference on line 10 as opposed to the ALT reference of the present invention.

Refer again to FIG. 1. The limiter outputs, lines 4 and 5, which correspond to line 15 on FIG. 2, are coupled to a summing means 53. The signal on line 6 which is the output of summing means 53 is a reconstructed rendition of the input signal on line 1 after being multiband limited, and for the purpose of the present invention is the final output signal.

Block 55 in FIG. 1 represents an Automatic Limit Threshold Circuit which outputs the ALT reference on line 10. The presently preferred circuit of ALT 55 is diagrammed in FIG. 3.

Figure 3:
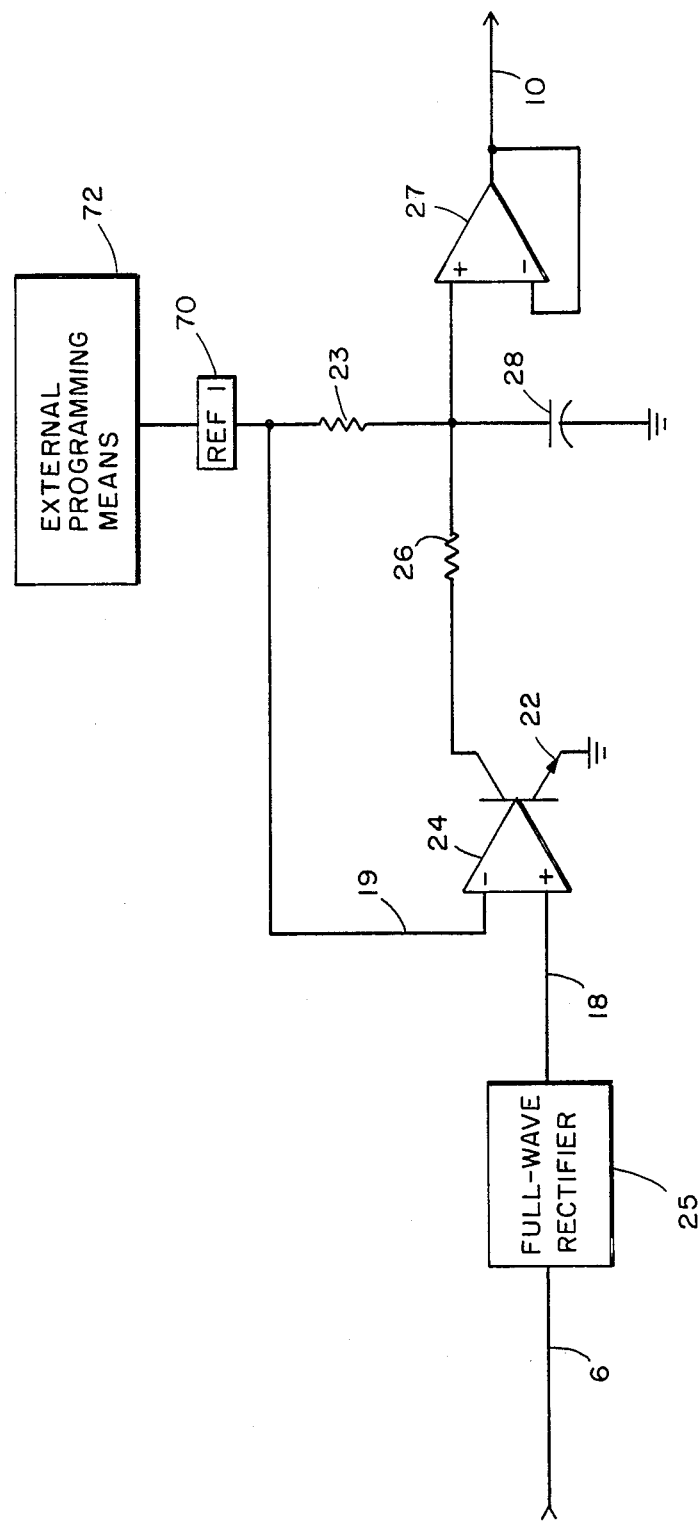
FIG. 3 is a schematic diagram of the automatic limit threshold circuit (ALT) in the multiband limiter shown in FIG. 1.

Referring now to FIG. 3 block 25 is unity gain full wave rectifier of conventional design. Therefore, further details of the operation of block 25 will be omitted in this disclosure.

Line 6 carries the output signal from the multiband limiter summing means 53 of FIG. 1. Block 25 thus outputs on line 18 an absolute value rendition of the total limiter output signal of line 6. The absolute value signal on line 18 is coupled to a comparator 24. Comparator 24 is coupled to a switch 22, which in the present embodiment is a transistor integral to comparator 24. One readily available integrated circuit suited to this comparator/switch function is the type LM3ii Voltage Comparator made by National Semiconductor Corp. The comparator 24 and switch 22 operate such that switch 22 is "on" (conducting) if the signal on line 18 is greater than a fixed reference voltage 70 (REF. 1) on line 19; otherwise the switch is "off" (non-conducting). Switch 22 is coupled to a storage capacitor 28 through a discharge resistor 26.

When switch 22 is closed, capacitor 28 will discharge through resistor 26 to a lower voltage determined by the ratio of resistors 23 and 26. In the present embodiment, this ratio is very large, and the charge on 28 can be discharged to nearly zero volts. When switch 22 is open, capacitor 28 will charge through resistor 23 to the voltage of REF. 1. The voltage developed on capacitor 28 is the ALT reference voltage and is coupled to buffer means 27 which drives the ALT reference line 10. External Programming Means 72 is coupled to fixed reference voltage 70.

REF. 1 defines 100 percent output level of the multiband limiting system. Therefore, if the total sum of the band limiter outputs, as seen on line 18, is below REF. 1, then the ALT output on line 10 will rise of Ref. 1, and remain steady at that value. The value on ALT line 10 determines the output level of the limiters. Now assume only a narrow band signal which passes through the low band is present at the limiter input, line 1. Let it rise in input level until it reaches the limit threshold and beyond. The low band limiter will limit its output level at the ALT level which equals Ref. 1. The signal seen on line 18 will then be equal to (but not exceed) Ref. 1. Therefore, comparator 24 will not close switch 22. As long as 22 stays open, the ALT reference will remain equal to REF. 1, and the total limiter output on line 6 will equal the defined 100 percent output level.

Now, assume an additional large signal component is supplied to the multiband limiter on line 1. This new signal passes only through the high band. Now, both bands will be outputting signals equal in level to REF. 1. The signal on line 18 will now be greater than Ref. 1 due to the summation of the output signals by 25. Therefore, comparator 24 closes switch 22 and begins to discharge capacitor 28. The ALT reference begins to rapidly fall in level, thus causing the band limiters to rapidly reduce their output levels by limiting at a lower threshold. This action continues until the absolute sum signal on line 18 (and the true output line 6) equals REF. 1 (or 100 percent). The slewing to a lower limiting threshold may be referred to a "overshoot correction" in certain discussions of the present invention, wherein the meaning of "overshoot" should be taken to be the excessive output signal which would exist if the ALT circuit were disabled in the operation just described in this paragraph.

How the ALT circuit adjusts the multiband limiter thresholds to result in a final output signal level of 100 percent, regardless of the relative band energy contents should now be readily apparent.

The timing of the charge/discharge cycles of capacitor 28 may be varied to complement a specific limiter embodiment in use. For example, a peak limiter will need a faster discharge of capacitor 28, thus faster overshoot correction than an rms limiter which may sound better with a slower rate of correction. The presently preferred embodiment uses time constants approximately equal to 4 milliseconds for discharge, and 330 milliseconds for charge. This large timing ratio imparts a "memory" to the ALT circuit, such that frequently occuring overshoots are maintained corrected with less slewing of the ALT reference. Generally, the larger the charge/discharge ratio, the longer the memory. The trade-off for longer memory, is longer normalizing time of the ALT reference for diminishing input signals, and thus lower average limiting density. Therefore, the ALT must not be validated only for specific time constants given, but recognized for the design choices which are available in the present perfection of the method.

The embodiment of the present invention is intended to be merely exemplary and those skilled in the art shall be able to make numerous variations and modifications to it without departing from the spirit of the present invention. All such variation and modifications are intended to be within the scope of the present invention as defined in the appended claims.

What is claimed is:

1. A multiband audio frequency signal limiter comprising:
   a. band splitting means for splitting an input signal into two or more frequency bands;
   b. limiter means coupled to said band splitting means for receiving the outputs of each frequency band;
   c. said limiter means acting to independently and separately limit the level of each band output to a common limiter reference level and output each limited band separately; d. an automatic limit threshold (ALT) circuit for controlling the limiter means; and
   e. band summing means for summing together the outputs of the limiter means to produce an amplitude limited output signal,
   f. said ALT circuit receiving and comparing the limited output signal from said band summing means to a fixed reference and outputting an automatically adjusted limiter reference voltage to said limiter means;
   g. whereby a multiband audio frequency signal limiter is realized which maintains a constant output level regardless of the relative energy content of the individual limiter bands.

2. The multiband audio frequency signal limiter defined by claim 1 and wherein said limiter means includes a means for externally adjusting the limiting threshold set by said limiter means.

3. The multiband audio frequency signal limiter of claim 1 and wherein the limiter means comprises a plurality of individual limiters and wherein each limiter includes a voltage controlled amplifier (VCA) means for receiving a band-split input signal and a first comparator for comparing the output of the VCA with a reference level signal from the ALT circuit and generating therefrom an error signal which is used to control the output of the VCA.

4. The multiband audio frequency limiter of claim 3 and wherein the output signal of the VCA is fed to the band summing means.

5. A multiband audio frequency signal limiter comprising:
   a. band splitting means for splitting an input signal into two or more frequency bands;
   b. limiter means coupled to said band splitting means for receiving the outputs of each frequency band;
   c. said limiter means acting to independently and separately limit the level of each band output to a common limiter reference level and output each limited band separately;

d. an automatic limit threshold (ALT) circuit for controlling the limiter means and e. band summing means for summing together the outputs of the limiter means to produce an amplitude limited output signal, f. said ALT circuit receiving and comparing the limited output signal from said band summing means to a fixed reference and outputting an automatically adjusted limiter reference voltage to said limiter means;

g. whereby a multiband audio frequency signal limiter is realized which maintains a constant output level regardless of the relative energy content of the individual limiter bands, and wherein the limiter means includes means for externally adjusting the limiting threshold set by the limiter means and wherein said ALT circuit comprises:

i. a full wave rectifier means for converting the amplitude limited output signal to a positive-sense absolute value signal;

ii. a comparator means with the positive input terminal coupled to said absolute value signal and the negative input terminal coupled to a preset positive reference voltage;

iii. a single-pole-single-throw switch means coupled to the output of said comparator such that if the positive comparator input is greater than the negative comparator input the switch is "on", or conducting; otherwise the switch is "off", or non-conducting;

iv. one terminal of said switch connected to circuit ground, and the other terminal connected to a first resistor which is connected in series with a second resistor to the said preset reference voltage;

v. the junction of said first and second resistors connected to the positive polarity terminal of a capacitor; the negative capacitor terminal connected to circuit ground;

vi. the junction of said first and second resistors connected to the positive polarity terminal of a capacitor; the negative capacitor terminal connected to circuit ground;

vii. the junction of the first and second resistors and capacitor coupled to the input of a high impedance voltage follower buffer;

viii. whereas the output of said buffer is the final ALT output signal.

6. The invention of claim 5 and wherein said switch comprises a transistor integrated into said comparator.

7. A multiband audio frequency signal limiter comprising:

a. a band splitter for splitting an input signal into first and second frequency bands, b. a first limiter for limiting the level of the output of the first frequency band to a common limiter reference level, c. a second limiter for limiting the level of the output of the second frequency band to said common limiter reference level, d. said first and second limiters being separate and acting independently from on another, e. band summing means for summing together the outputs of the first and second limiter means and producing an amplitude limited output signal which is the output of the multiband audio frequency signal limiter, and f. an automatic limit threshold (ALT) system for receiving and comparing the output from the band summing means to a fixed reference voltage and outputting an automatically adjusted second reference level voltage signal which is applied to said first and second limiters as said common reference level.

8. A multiband audio frequency signal limiter (MAFSL) comprising:

a. band splitting means for splitting an input signal into a plurality of frequency bands, b. separate limiter means coupled to each output of the band splitting means and serving to independently limit the level of each frequency band output to a common reference level, each limiter means including a gain control device, c. summing means for summing together the output of each one of the separate limiter means and producing therefrom a single final output amplitude limited signal, said single final amplitude limited output signal being the output of the multiband audio frequency signal limiter, and d. an automatic limit threshold (ALT) circuit for generating an automatically adjusted limited reference voltage control signal for use in controlling the gain of the gain control device in each limiter means, said ALT circuit being coupled to the output of the summing means and comprising:

i. a full wave rectifier coupled to the output of the summing means for converting the output of the summing means to a positive-sense absolute value signal, ii. a first comparator for comparing the output of the full wave rectifier with a fixed reference voltage signal, iii. a switch coupled to and controlled by the output of the comparator, and iv. a buffer connected to an output of the switch for buffering the output of the switch, the output of the buffer constituting the output of the ALT.

9. The MAFSL of claim 8 and wherein each limiter means further includes a comparator having one input coupled to the gain control device, another input coupled to the ALT, and a filter, said filter being coupled to the output of the comparator and to the control signal input of the gain control device.

10. The MAFSL of claim 8 and wherein the gain control device in each limiter means is a voltage controlled amplifier (VCA).

11. The MAFSL of claim 10 and wherein the plurality of frequency bands comprises two frequency bands and wherein the limiter means comprises a first limiter connected to one frequency band and a second limiter connected to the other frequency band.

12. The MAFSL of claim 1 and wherein each limiter has a comparator, and the output of the comparator in each limiter means switches states between high and low depending on whether the output of its respective gain control device is lesser or greater than the output of the ALT.

13. The MAFSL of claim 12 and wherein each limiter further comprises a filter, and the polarity of operation of the comparator and filter in each limiter means combine to cause a reduction in gain of the gain control device when the gain control device's output signal exceeds the output of the ALT.

14. The MAFSL of claim 13 and wherein the ALT includes a timing circuit.

15. The MAFSL of claim 14 and wherein the switch in the ALT system is a binary switch in the form of a transistor having its emitter connected to ground, its base connected to the first comparator and its collector connected to the timing circuit.

* * * * *